(12) United States Patent
Goto et al.

(10) Patent No.: US 10,536,131 B2
(45) Date of Patent: Jan. 14, 2020

(54) SURFACE ACOUSTIC WAVE DEVICE WITH THERMALLY CONDUCTIVE LAYER

(71) Applicant: Skyworks Solutions, Inc., Woburn, MA (US)

(72) Inventors: Rei Goto, Osaka (JP); Toru Yamaji, Nagaokakyou (JP)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 16/011,399

(22) Filed: Jun. 18, 2018

(65) Prior Publication Data

US 2018/0367117 A1 Dec. 20, 2018

Related U.S. Application Data

(60) Provisional application No. 62/522,603, filed on Jun. 20, 2017, provisional application No. 62/522,588, filed on Jun. 20, 2017.

(51) Int. Cl.
*H03H 9/02* (2006.01)
*H03H 9/10* (2006.01)
*H03H 9/145* (2006.01)
*H03H 9/25* (2006.01)
*H03H 9/64* (2006.01)
*H03H 9/72* (2006.01)
*H03F 3/19* (2006.01)
*H03F 3/24* (2006.01)
*H04B 1/38* (2015.01)
(Continued)

(52) U.S. Cl.
CPC ............ *H03H 9/02834* (2013.01); *H03F 3/19* (2013.01); *H03F 3/21* (2013.01); *H03F 3/245* (2013.01); *H03H 9/02559* (2013.01); *H03H 9/02897* (2013.01); *H03H 9/1064* (2013.01); *H03H 9/145* (2013.01); *H03H 9/25* (2013.01); *H03H 9/6483* (2013.01); *H03H 9/6489* (2013.01); *H03H 9/725* (2013.01); *H04B 1/38* (2013.01); *H04B 11/00* (2013.01); *H04B 15/00* (2013.01); *H03F 2200/451* (2013.01)

(58) Field of Classification Search
USPC .......................................... 455/73
See application file for complete search history.

(56) References Cited

U.S. PATENT DOCUMENTS 4,037,176 A 7/1977 Ono et al.
5,446,330 A 8/1995 Eda et al.
(Continued)

OTHER PUBLICATIONS

Kadota, et al., "Improved Quality Factor of Hetero Acoustic Layer (HAL) SAW Resonator Combining LiTaO3 Thin Plate and Quartz Substrate," 2017 IEEE International Ultrasonics Symposium (IUS), Sep. 2017.

*Primary Examiner* — Eugene Yun
(74) *Attorney, Agent, or Firm* — Knobbe, Martens, Olson & Bear, LLP

(57) ABSTRACT

Aspects of this disclosure relate to a surface acoustic wave device that includes a thermally conductive layer configured to dissipate heat of the surface acoustic wave device. The surface acoustic wave device includes a piezoelectric layer and an interdigital transducer electrode on the piezoelectric layer. The thermally conductive layer can be thinner than the piezoelectric layer. Related radio frequency modules and wireless communication devices are disclosed.

21 Claims, 8 Drawing Sheets

(51) Int. Cl.
*H04B 11/00* (2006.01)
*H03F 3/21* (2006.01)
*H04B 15/00* (2006.01)

(56) References Cited

U.S. PATENT DOCUMENTS

| | | |
|---|---|---|
| 6,310,423 B1 | 10/2001 | Tanaka et al. |
| 7,105,980 B2 | 9/2006 | Abbott et al. |
| 7,245,193 B2 | 7/2007 | Funasaka |
| 7,331,092 B2 | 2/2008 | Miura et al. |
| 7,800,464 B2 | 9/2010 | Tajima et al. |
| 7,911,111 B2 | 3/2011 | Suzuki et al. |
| 8,384,268 B2 | 2/2013 | Kadota |
| 9,276,558 B2 | 3/2016 | Kando et al. |
| 9,438,201 B2 | 9/2016 | Hori et al. |
| 2001/0029650 A1* | 10/2001 | Takata .............. H03H 3/10 29/25.35 |
| 2005/0127794 A1 | 6/2005 | Ozaki et al. |
| 2007/0182279 A1 | 8/2007 | Kawano et al. |
| 2009/0091904 A1 | 4/2009 | Hatanaka et al. |
| 2009/0201102 A1 | 8/2009 | Oda |
| 2009/0243430 A1 | 10/2009 | Yokota et al. |
| 2009/0295508 A1 | 12/2009 | Isobe et al. |
| 2010/0038993 A1* | 2/2010 | Umeda .............. H03H 9/02574 310/313 B |
| 2014/0225684 A1 | 8/2014 | Kando et al. |
| 2014/0333703 A1* | 11/2014 | Buskirk .............. B41J 2/17596 347/85 |
| 2015/0069882 A1 | 3/2015 | Umeda et al. |
| 2016/0261248 A1 | 9/2016 | Grousset et al. |
| 2016/0301386 A1 | 10/2016 | Iwamoto |
| 2017/0093371 A1 | 3/2017 | Takamine |

\* cited by examiner

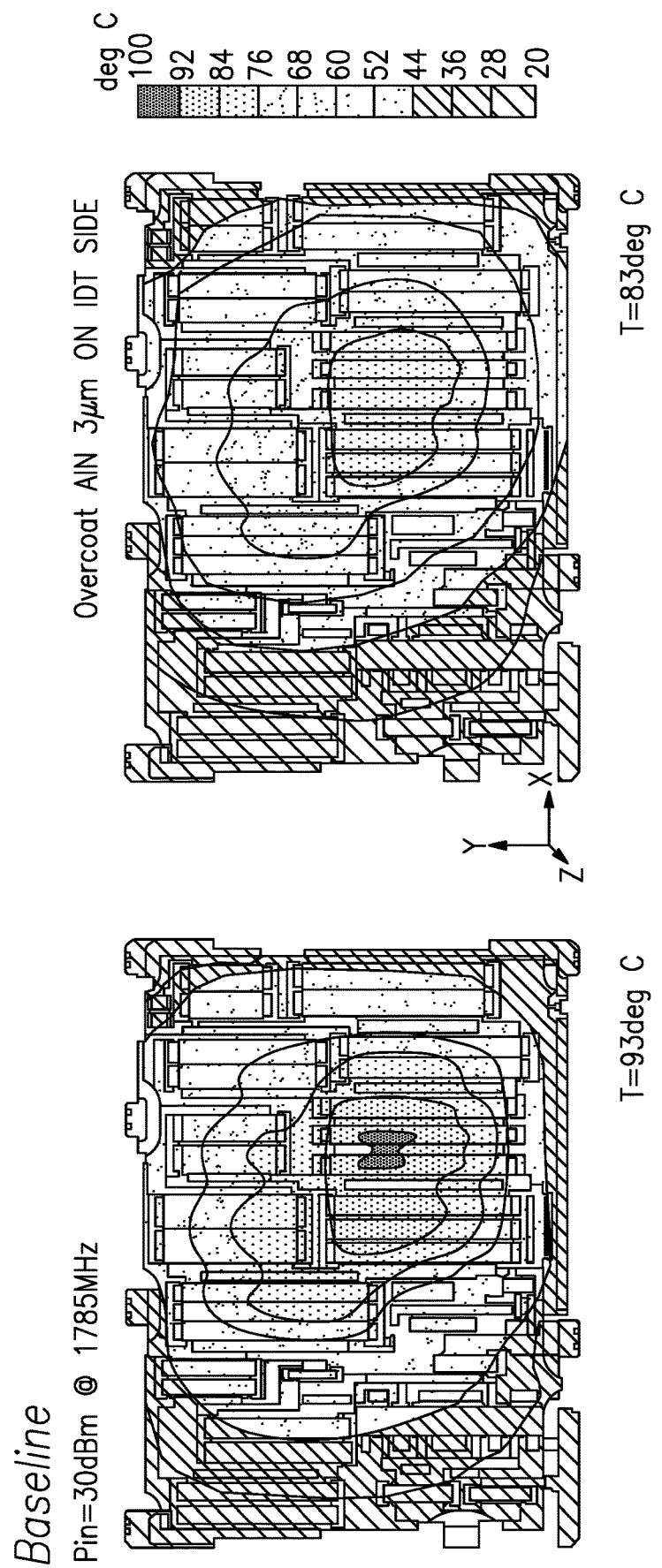

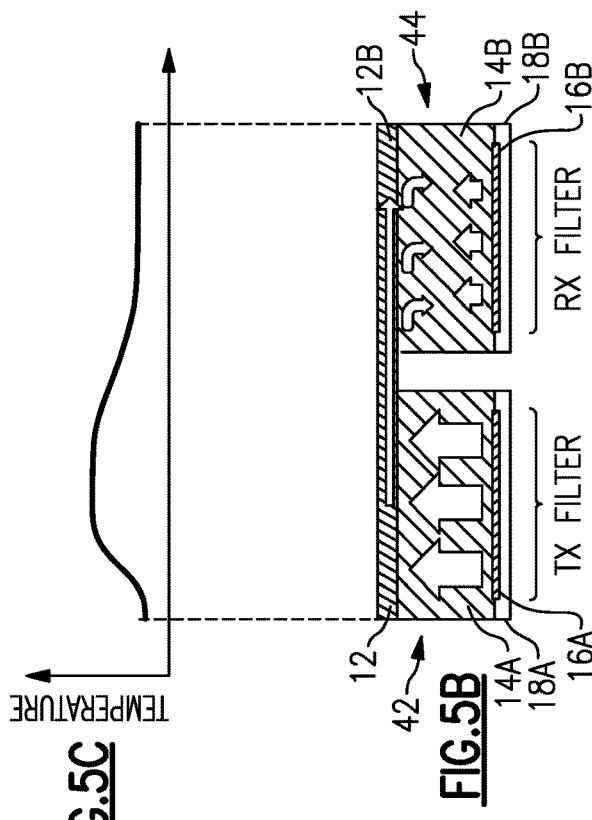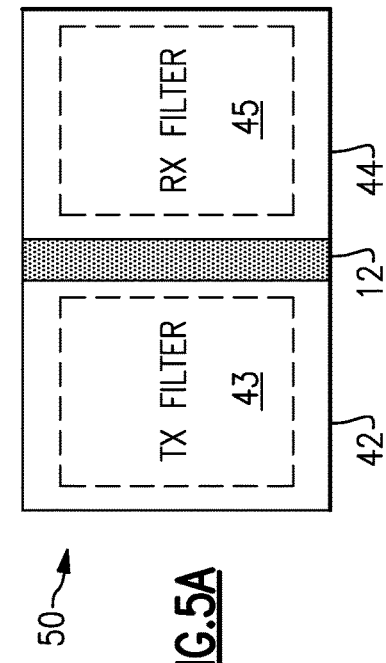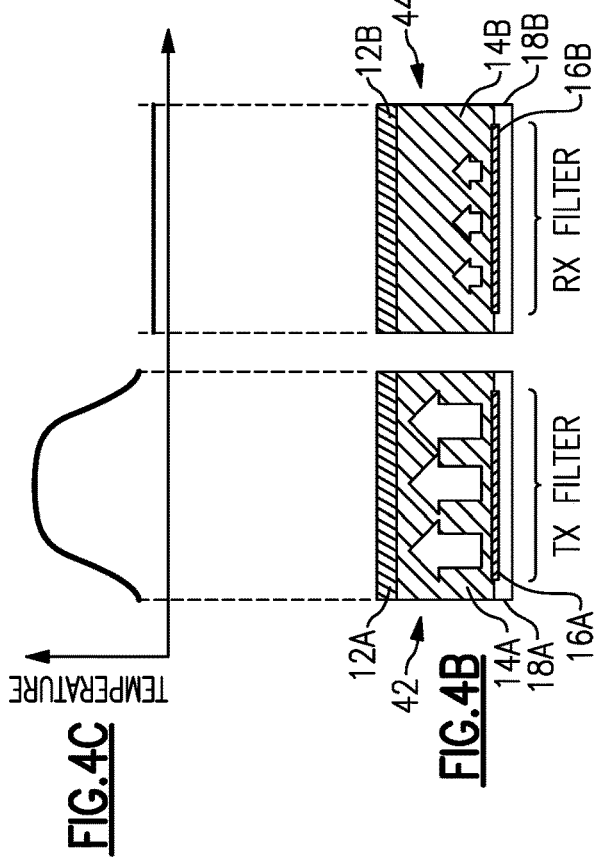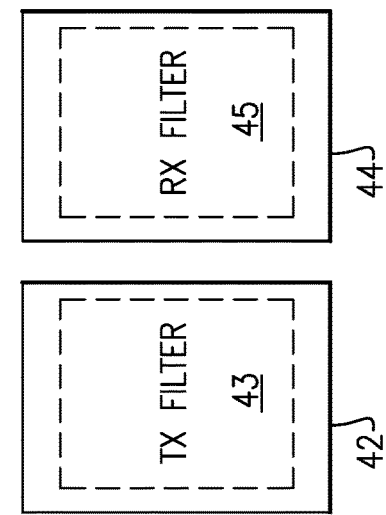

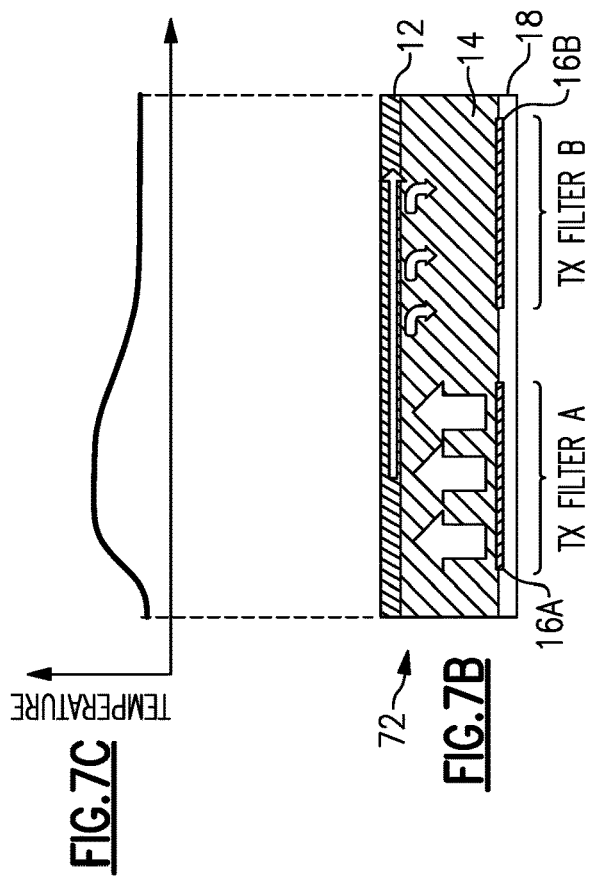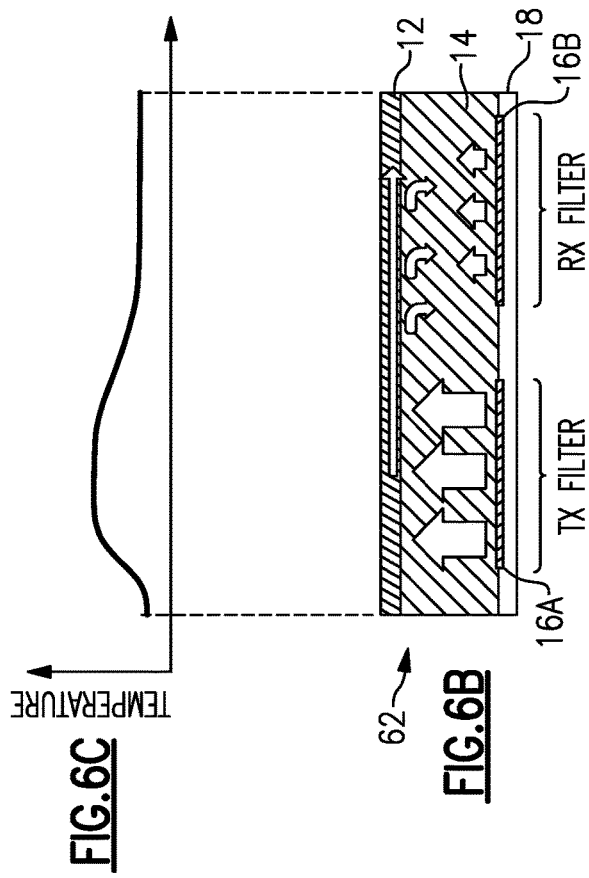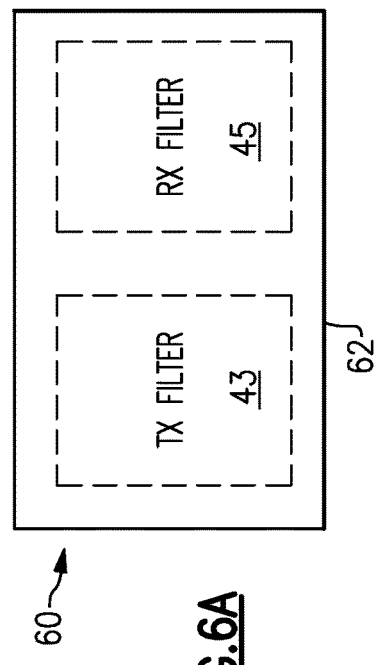

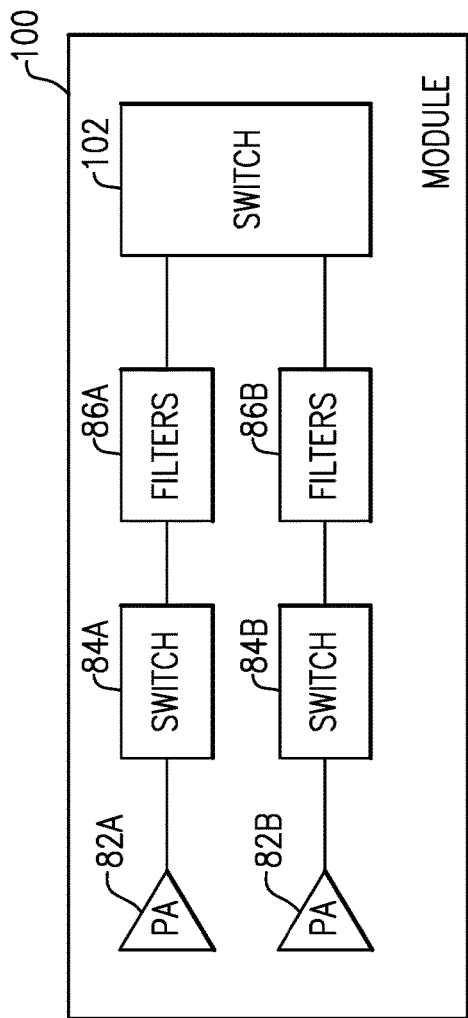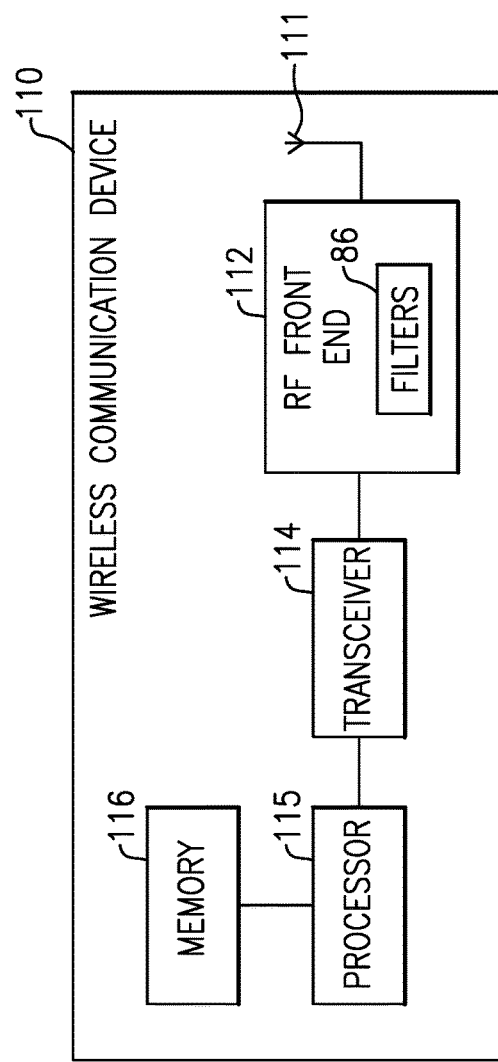

SURFACE ACOUSTIC WAVE DEVICE WITH THERMALLY CONDUCTIVE LAYER

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application claims the benefit of priority under 35 U.S.C. § 119(e) of U.S. Provisional Patent Application No. 62/522,603, filed Jun. 20, 2017 and titled "SURFACE ACOUSTIC WAVE DEVICE WITH THERMALLY CONDUCTIVE LAYER," the disclosure of which is hereby incorporated by reference in its entirety herein. This application claims the benefit of priority under 35 U.S.C. § 119(e) of U.S. Provisional Patent Application No. 62/522,588, filed Jun. 20, 2017 and titled "SURFACE ACOUSTIC WAVE FILTERS WITH THERMALLY CONDUCTIVE SHEET," the disclosure of which is hereby incorporated by reference in its entirety herein.

BACKGROUND

Technical Field

Embodiments of this disclosure relate to surface acoustic wave devices.

Description of Related Technology

A surface acoustic wave filter can include a plurality of resonators arranged to filter a radio frequency signal. Each resonator can include a surface acoustic wave device. Surface acoustic wave filters can be implemented in radio frequency electronic systems. For instance, filters in a radio frequency front end of a mobile phone can include surface acoustic wave filters. Two surface acoustic wave filters can be arranged as a duplexer. Filtering signals having relatively high power levels can generate heat.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a surface acoustic wave device that includes a piezoelectric layer, an interdigital transducer electrode on the piezoelectric layer, and a thermally conductive layer configured to dissipate heat of the surface acoustic wave device. The thermally conductive layer is thinner than the piezoelectric layer.

The thermally conductive layer and the interdigital transducer electrode can be on opposing sides of the piezoelectric substrate. The thermally conductive layer can also be in physical contact with the piezoelectric layer.

The thermally conductive layer can be an electrically insulating layer. The thermally conductive layer can be nontoxic. The thermally conductive layer can have a thermal conductivity that is at least 5 times the thermal conductivity of the piezoelectric layer. The thermally conductive layer can have a thermal conductivity of at least 23 W/mK. For instance, the thermal conductivity of the thermally conductive layer can be in a range from 23 W/mK to 300 W/mK.

A thickness of the thermally conductive layer can be less than half of a thickness of the piezoelectric layer. The thickness of the thermally conductive layer can be greater than 6.3 micrometers.

The thermally conductive layer can include aluminum nitride. The thermally conductive layer can include silicon nitride. The thermally conductive layer can include a material that includes at least one of silicon or a nitride.

The piezoelectric layer can include lithium tantalate. The piezoelectric layer can include lithium niobate. The piezoelectric layer can have a thickness of less than 300 micrometers.

The surface acoustic wave device can further include silicon dioxide over the interdigital transducer electrode.

One aspect of this disclosure is a surface acoustic wave device that includes a lithium niobate layer, an interdigital transducer electrode on the lithium niobate layer, and an aluminum nitride layer on an opposite side of the lithium niobate layer than the interdigital transducer electrode. The aluminum nitride layer is configured to dissipate heat of the surface acoustic wave device. The aluminum nitride layer is thinner than the lithium niobate layer.

The lithium niobate layer can be at least twice as thick as the aluminum nitride layer. The aluminum nitride layer can be at least 6.3 micrometers thick.

The aluminum nitride layer can be in physical contact with the lithium niobate layer.

The surface acoustic wave device can further include a silicon dioxide layer over the interdigital transducer electrode.

Another aspect of this disclosure is a surface acoustic wave filter that includes a piezoelectric layer, an interdigital transducer electrode on the piezoelectric layer, and a thermally conductive layer configured to dissipate heat of the surface acoustic wave device. The thermally conductive layer is thinner than the piezoelectric layer. The surface acoustic wave filter is configured to filter a radio frequency signal.

The surface acoustic wave filter can include one or more suitable features of any of the surface acoustic wave devices discussed herein.

Another aspect of this disclosure is a radio frequency module that includes a power amplifier configured to provide a radio frequency signal and a surface acoustic wave filter configured to filter the radio frequency signal. The surface acoustic wave filter includes a piezoelectric layer, an interdigital transducer electrode on the piezoelectric layer, and a thermally conductive layer configured to dissipate heat of the surface acoustic wave device. The thermally conductive layer is thinner than the piezoelectric layer.

The surface acoustic wave filter and a second surface acoustic wave filter can be implemented on a single die. The thermally conductive layer can be configured to dissipate heat from the first acoustic wave filter over an area of the second surface acoustic wave filter.

The radio frequency module can include one or more suitable features of any of the surface acoustic wave devices and/or surface acoustic wave filters discussed herein.

Another aspect of this disclosure is a mobile device that includes a surface acoustic wave filter configured to provide a filtered radio frequency signal and an antenna configured to transmit the filtered radio frequency signal. The surface acoustic wave filter includes a piezoelectric layer, an interdigital transducer electrode on the piezoelectric layer, and a thermally conductive layer configured to dissipate heat of the surface acoustic wave device. The thermally conductive layer is thinner than the piezoelectric layer.

The mobile device can include one or more suitable features of any of the surface acoustic wave devices, surface acoustic wave filters, and/or radio frequency modules discussed herein.

Another aspect of this disclosure is a surface acoustic wave filter chip that includes a first surface acoustic wave filter including a piezoelectric layer, a second surface acoustic wave filter, and a thermally conductive sheet configured to dissipate heat from the first surface acoustic wave filter in an area corresponding to the second surface acoustic wave filter. The thermally conductive sheet is thinner than the piezoelectric layer.

The first surface acoustic wave filter can be a transmit filter and the second surface acoustic wave filter can be a receive filter. The first surface acoustic wave filter can be a transmit filter of a duplexer and the second surface acoustic wave filter can be a receive filter of the duplexer. The first surface acoustic wave filter can be a first transmit filter and the second surface acoustic wave filter can be a second transmit filter, in which the first transmit filter and the second transmit filter are arranged to be active at different times.

The first surface acoustic wave filter can include a first interdigital transducer electrode on the piezoelectric layer and the second acoustic wave filter can include a second interdigital transducer electrode. The thermally conductive layer can be on an opposing side of the piezoelectric layer than the first interdigital transducer electrode and extend under the first interdigital transducer electrode and the second interdigital transducer electrode. The thermally conductive sheet can be an aluminum nitride layer. The surface acoustic wave filter chip can further include a silicon dioxide layer over the first interdigital transducer electrode and the second interdigital transducer electrode.

The thermally conductive sheet and an interdigital transducer electrode of the first surface acoustic wave filter can be on opposing sides of the piezoelectric layer. The thermally conductive sheet can be in physical contact with the piezoelectric layer.

The thermally conductive sheet can be a nontoxic electrically insulating layer.

A thickness of the thermally conductive sheet can be less than half of a thickness of the piezoelectric layer. A thickness of the thermally conductive sheet can be greater than 6.3 micrometers.

The thermally conductive layer can include aluminum nitride. The piezoelectric layer can include lithium niobate. The piezoelectric layer can have a thickness of less than 300 micrometers.

The surface acoustic wave filter chip can further include silicon dioxide over an interdigital transducer electrode of the first surface acoustic wave filter.

Another aspect of this disclosure is a surface acoustic wave filter chip that includes a first surface acoustic wave filter including a lithium niobate layer, a second surface acoustic wave filter, and an aluminum nitride layer configured to dissipate heat from the first surface acoustic wave filter in an area corresponding to the second surface acoustic wave filter. The aluminum nitride layer is thinner than the lithium niobate layer.

The first surface acoustic wave filter can be a transmit filter and the second surface acoustic wave filter can be a receive filter. The first surface acoustic wave filter can be a transmit filter of a duplexer and the second surface acoustic wave filter can be a receive filter of the duplexer. The first surface acoustic wave filter can be a first transmit filter and the second surface acoustic wave filter can be a second transmit filter, in which the first transmit filter and the second transmit filter are arranged to be active at different times.

The first surface acoustic wave filter can include a first interdigital transducer electrode on the piezoelectric layer and the second acoustic wave filter can include a second interdigital transducer electrode. The aluminum nitride layer can be on an opposing side of the piezoelectric layer than the first interdigital transducer electrode and can extend under the first interdigital transducer electrode and the second interdigital transducer electrode.

The lithium niobate layer can be at least twice as thick as the aluminum nitride layer. The aluminum nitride layer can be at least 6.3 micrometers thick.

The aluminum nitride layer can be in physical contact with the lithium niobate layer.

The surface acoustic wave chip can further include a silicon dioxide layer over an interdigital transducer electrode of the first surface acoustic wave filter.

Another aspect of this disclosure is a surface acoustic wave filter assembly that includes a first surface acoustic wave filter including a piezoelectric layer, a second surface acoustic wave filter, and a thermally conductive sheet extending over a first area corresponding to the first acoustic wave filter and a second area corresponding to the second acoustic wave filter. The thermally conductive sheet is configured to dissipate heat from the first surface acoustic wave filter over the second area. The thermally conductive sheet is thinner than the piezoelectric layer.

The surface acoustic wave filter assembly can include one or more suitable features of the surface acoustic wave chips discussed herein.

Another aspect of this disclosure is a radio frequency module that includes a power amplifier configured to provide a radio frequency signal and a surface acoustic wave filter assembly that includes one or more suitable features of the surface acoustic wave filters discussed herein.

Another aspect of this disclosure is mobile device that includes surface acoustic wave filter assembly including one or more suitable features of the surface acoustic wave devices discussed herein and an antenna configured to transmit a radio frequency signal from the surface acoustic wave filter assembly.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/011,367, titled "ACOUSTIC WAVE FILTERS WITH THERMALLY CONDUCTIVE SHEET," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIG. 3A is a simulated heat map of a surface acoustic wave chip without a thermally conductive layer.

FIG. 3B is a simulated heat map of a surface acoustic wave chip with an aluminum nitride layer on an interdigital transducer electrode side according to an embodiment.

FIG. 4A is a block diagram of filters implemented on separate chips with thermally conductive layers. FIG. 4B is a cross sectional view of FIG. 4A. FIG. 4C illustrates temperature over position for the chips of FIG. 4A.

FIG. 5A is a block diagram of filters implemented on separate chips with a common thermally conductive layer. FIG. 5B is a cross sectional view of FIG. 5A. FIG. 5C illustrates temperature over position for the chips of FIG. 5A.

FIG. 6A is a block diagram of a transmit filter and a receive filter implemented on a single chip with a thermally conductive layer. FIG. 6B is a cross sectional view of FIG. 6A. FIG. 6C illustrates temperature over position for the chip of FIG. 6A.

FIG. 7A is a block diagram of transmit filters implemented on a single chip with a thermally conductive layer. FIG. 7B is a cross sectional view of FIG. 7A. FIG. 7C illustrates temperature over position for the chip of FIG. 7A.

FIG. 10 is a schematic block diagram of a module that includes power amplifiers, switches, filters in accordance with one or more embodiments, and an antenna switch.

FIG. 11 is a schematic block diagram of a wireless communication device that includes filters in accordance with one or more embodiments.

DETAILED DESCRIPTION OF CERTAIN EMBODIMENTS

Figure 1C:
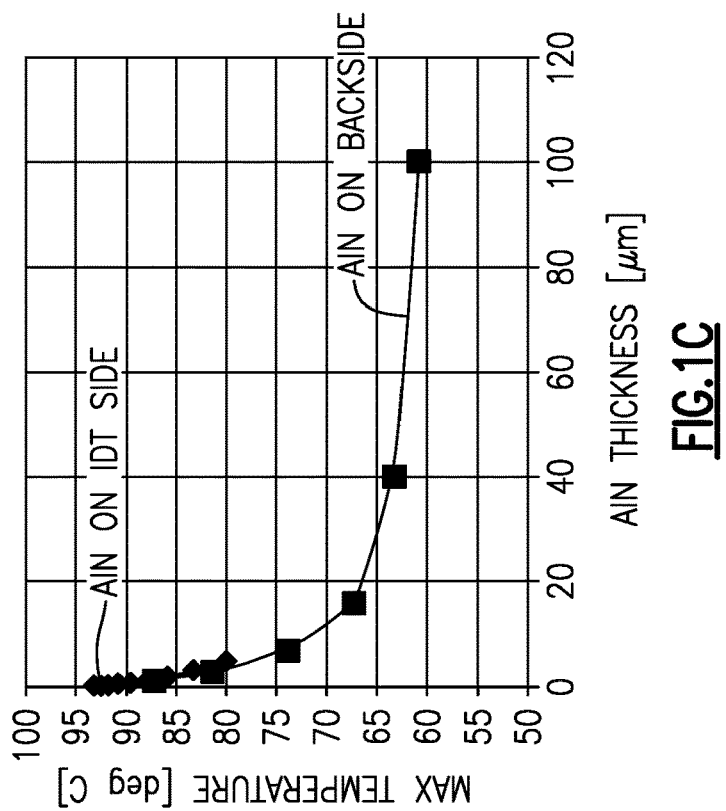
FIG. 1C is a graph that illustrates relationships between simulated maximum chip temperature and thickness of an aluminum nitride thermally conductive layer for embodiments of the surface acoustic wave device of FIG. 1A and the surface acoustic wave device of 1B.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Power durability of a surface acoustic wave (SAW) filter device is becoming increasingly significant in certain applications. This disclosure provides technical solutions that can improve the power durability of SAW filter devices. A SAW filter can be arranged as a ladder filter of that includes series surface acoustic wave device resonators and shunt surface acoustic wave device resonators.

A SAW device with a thermally conductive layer is disclosed. The thermally conductive layer can have a relatively high thermal conductivity. The thermally conductive layer has a higher conductivity than a piezoelectric layer of the SAW device. For instance, the thermal conductivity of the thermally conductive layer can be at least 5 times higher than the thermal conductivity of the piezoelectric layer of the SAW device. In this example, the piezoelectric layer can be a lithium niobate layer with a thermal conductivity of 4.6 W/mK or a lithium tantalate layer with a thermal conductivity of 4.24 W/mK, and the thermally conductive layer can have a thermal conductivity of at least 23 W/mK. The thermal conductivity of the thermally conductive layer can be in a range from 23 W/mK to 300 W/mK, such as in a range from 140 W/mK to 300 W/mK. In certain instances, the thermal conductivity of the thermally conductive layer can be at least 25 times higher than the thermal conductivity of the piezoelectric layer of the SAW device. The thermally conductive layer can be an aluminum nitride (AlN) layer, a silicon nitride (SiN) layer, or any other suitable thermally conductive layer, such as a thermally conductive layer that includes a nitride and/or silicon.

The thermally conductive layer can be bonded to the piezoelectric layer. The thermally conductive layer can be in physical contact with a piezoelectric substrate on a side opposite to an interdigital transducer (IDT) electrode of the SAW device.

The thermally conductive layer can be thinner than the piezoelectric layer and have a thickness of at least 6.3 micrometers (um). The thickness of the thermally conductive sheet can be less than a thickness of the piezoelectric layer. The thermally conductive layer can be referred to as a thermally conductive sheet. The piezoelectric layer can be thinner than 300 um. The piezoelectric layer can be a lithium tantalate ($LiTaO_3$) layer or a lithium niobate ($LiNbO_3$) layer.

A single chip can include two or more SAW filters that include a thermally conductive layer in accordance with the principles and advantages discussed herein.

Figure 1A:
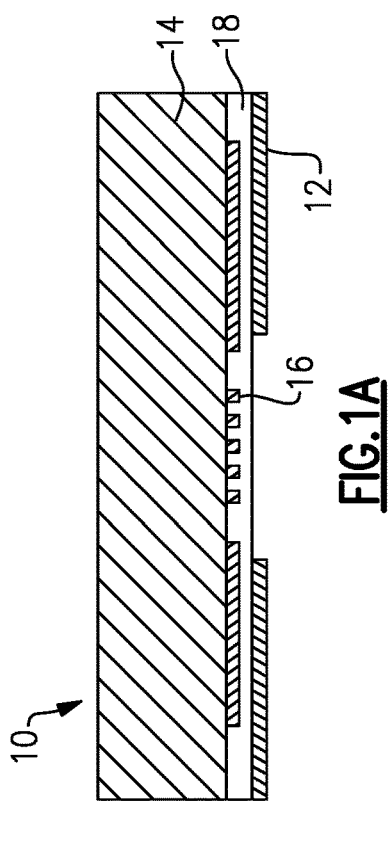
FIG. 1A illustrates a cross section of a surface acoustic wave device with a thermally conductive layer on an interdigital transducer electrode side according to an embodiment.

FIG. 1A illustrates a cross section of a surface acoustic wave device 10 with a thermally conductive layer on an interdigital transducer electrode side according to an embodiment. The illustrated surface acoustic wave device 10 includes an aluminum nitride layer 12, lithium niobate layer 14, an interdigital transducer (IDT) electrode 16, and a silicon dioxide layer 18. The aluminum nitride layer 12 is a thermally conductive layer. The aluminum nitride layer 12 can function as a heat sink. The aluminum nitride layer 12 can be a polycrystalline aluminum nitride ceramic.

In FIG. 1A, the aluminum nitride layer 12 is formed on an IDT side of the lithium niobate layer 14. As illustrated, the aluminum nitride layer 12 is formed over the lithium niobate layer 14 except for an area over the IDT electrode 16. This can avoid and/or substantially reduce an acoustic effect of the aluminum nitride layer 12 on the functioning of the surface acoustic wave device 10. In FIG. 1A, the silicon dioxide layer 18 is over the IDT electrode 16 and between the lithium niobate layer 14 and the aluminum nitride layer 12. The IDT electrode 16 can be an aluminum IDT electrode. IDT electrode material can include titanium (Ti), gold (Au), silver (Ag), copper (Cu), platinum (Pt), tungsten (W), molybdenum (Mo), ruthenium (Ru), or any suitable combination thereof. For instance, the IDT electrode 16 can include aluminum and molybdenum in certain applications.

Figure 1B:
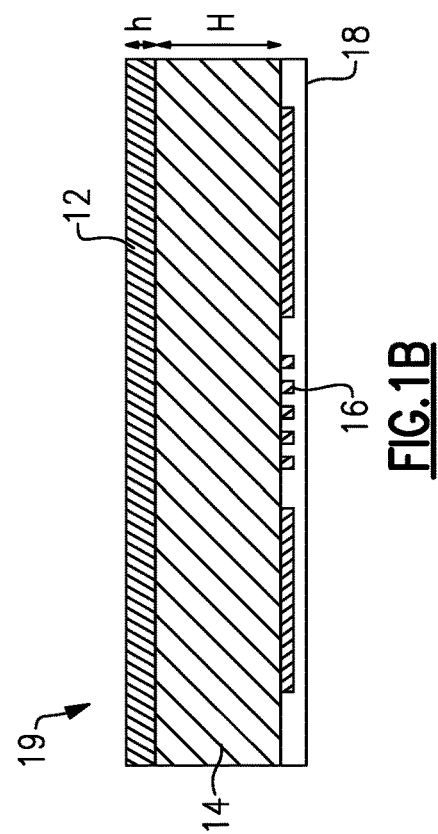
FIG. 1B illustrates a cross section of a surface acoustic wave device with a thermally conductive layer on a back side according to an embodiment.

FIG. 1B illustrates a cross section of a surface acoustic wave device 19 with a thermally conductive layer on a back side according to an embodiment. The illustrated surface acoustic wave device 19 includes an aluminum nitride layer 12, lithium niobate layer 14, an IDT electrode 16, and a silicon dioxide layer 18. In FIG. 1B, the aluminum nitride layer 12 is formed on a side of the lithium niobate layer 14 that is opposite to the IDT electrode 16. The side of the lithium niobate layer 14 that is opposite to the IDT electrode 16 can be referred to as a back side of the surface acoustic wave device 19. As illustrated, the aluminum nitride layer 12 is in physical contact with the lithium niobate layer 14. The aluminum nitride layer 12 can be bonded to the lithium niobate layer 14. In FIG. 1A, the silicon dioxide layer 18 is over the IDT transducer electrode 16 on a side of the lithium niobate layer 14 opposite to the aluminum nitride layer 14.

The thickness of the aluminum nitride layer 12 is labeled h and the thickness of the lithium niobate layer 14 is labeled H in FIG. 1B. As shown in both FIG. 1A and FIG. 1B, the aluminum nitride layer 12 can be relatively thin. The thickness h of the aluminum nitride layer 12 is less than the thickness H of the lithium niobate layer 14. The thickness h of the aluminum nitride layer 12 is less than half of the thickness H of the lithium niobate layer 14 as illustrated.

The aluminum nitride layer 12 has desirable properties for implementing a thermally conductive layer. Aluminum nitride is electrically insulating. Aluminum nitride is non-toxic. Aluminum nitride has a relatively high thermal conductivity. For example, aluminum nitride can have a thermal conductivity in a range from about 140 W/m·° K (Watts per meter-Kelvin) to 260 W/m·° K. Such a thermal conductivity is relatively high for an insulating ceramic. The thermal conductivity of aluminum nitride is more than 25 times the thermal conductivity of lithium niobate. The thermal conductivity of lithium niobate can be about 4.6 W/m·° K, Lithium tantalate can have a thermal conductivity of about 4.24 W/m·° K. Reducing impurities present in aluminum nitride grain boundaries is thought to be one way to increase the thermal conductivity of the aluminum nitride.

The surface acoustic wave device 10 of FIG. 1A and the surface acoustic wave device 19 of FIG. 1B are example surface acoustic wave devices. These surface wave devices are resonators arranged to generate a surface acoustic wave. In these surface acoustic wave devices, a lithium niobate layer is a piezoelectric layer and aluminum nitride layer is a thermally conductive layer. In some other embodiments, a different piezoelectric layer can be used, such as lithium tantalate. Alternatively or additionally, other suitable thermally conductive layers can be implemented, such as silicon nitride, or any other suitable thermally conductive layer, such as a thermally conductive layer that includes a nitride and/or silicon. The thermally conductive layer can be electrically insulating rather than electrically conductive or a semiconductor. The thermally conductive layer can be non-toxic.

In these surface acoustic wave devices of FIGS. 1A and 1B, a silicon dioxide layer is a temperature compensating layer that can bring a temperature coefficient of frequency (TCF) of the surface acoustic wave device closer to zero. In some other embodiments, a different temperature compensating layer can be implemented. The temperature compensating layer can have a positive TCF. Some example temperature compensating layers include a tellurium dioxide (TeO$_2$) layer or a silicon oxyfluoride (SiOF) layer. Although the surface acoustic wave device 10 of FIG. 1A and the surface acoustic wave device 19 of FIG. 1B include silicon dioxide layers, surface acoustic wave devices in accordance with any of the principles and advantages discussed herein can be implemented without a silicon dioxide layer over an IDT electrode in certain embodiments.

FIG. 1C is a graph that illustrates relationships between simulated maximum chip temperature and thickness of an aluminum nitride layer for embodiments of the surface acoustic wave device 10 of FIG. 1A and the surface acoustic wave device 19 of FIG. 1B. The thickness of the aluminum nitride layer is denoted as h in FIG. 1B. In these simulations, a specific heat of $0.71 \times 10^3$ J/Kg·° K was used for aluminum nitride, a density of $3.26 \times 10^3$ Kg/m$^3$ was used for aluminum nitride, and a thermal conductivity of 150 W/m·° K was used for aluminum nitride. As shown in FIG. 1C, the aluminum nitride thickness can significantly impact maximum chip temperature.

Figure 2:
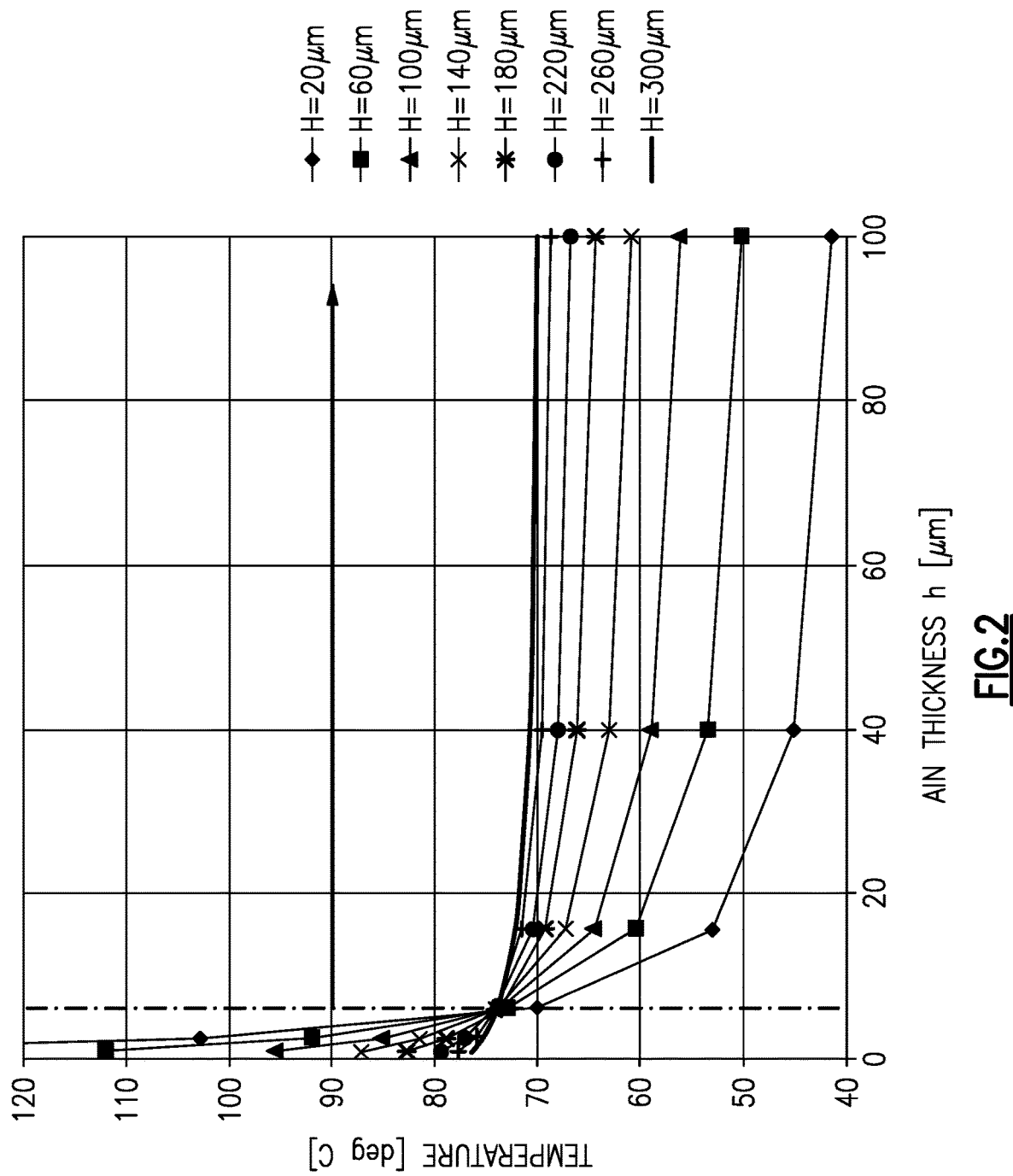
FIG. 2 is a graph that illustrates a relationship between temperature and thickness of an aluminum nitride thermally conductive layer for different piezoelectric layer thicknesses for an embodiment of the surface acoustic wave device of FIG. 1B.

FIG. 2 is a graph that illustrates a relationship between temperature and thickness of an aluminum nitride thermally conductive layer for different piezoelectric layer thicknesses for embodiments of the surface acoustic wave device 19 of FIG. 1B. The curves of FIG. 2 correspond to different thicknesses H of the lithium niobate layer 14 versus maximum chip temperature. These curves indicate that an aluminum nitride layer 12 in the surface acoustic wave device 19 having a thickness of at least 6.3 micrometers (um) can significantly improve thermal performance and result in a desirable thermal performance for a lithium niobate layer having a thickness in a range from 20 um to 300 um. Accordingly, a relatively thin aluminum nitride layer can provide thermal improvement. The curves in FIG. 2 indicate that desirable thermal improvement can be achieved with an aluminum nitride layer having a thickness that is less than the half of thickness of the lithium niobate layer. For certain lithium niobate thicknesses, the thickness of the aluminum nitride layer can be one tenth or less of the thickness of the lithium niobate layer and achieve desirable thermal improvement. The thickness of the aluminum nitride layer can be in range from 6.3 um to 100 um and provide desirable thermal improvement as indicated by FIG. 2.

A relatively thin thermally conductive layer is advantageous in a variety of applications. Compared to relatively thick thermally conductive layers, relatively thin thermally conductive layers can result in parts than are thinner, can use less material, can be implemented less expensively, and/or can be manufactured in less time. Depositing the thermally conductive layer can cause internal stress and/or warping on a wafer. There can be less cracking and/or warping with a relatively thin thermally conductive layer compared to with a relatively thick thermally conductive layer.

Figure 3C:
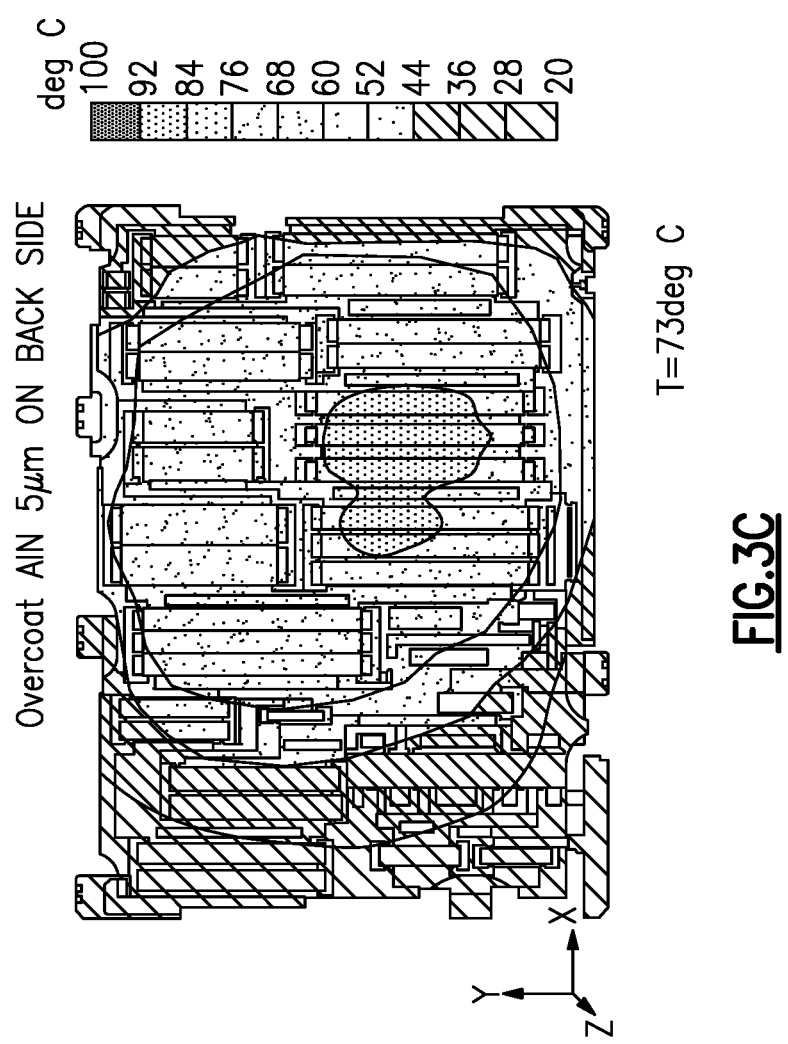
FIG. 3C is a simulated heat map of a surface acoustic wave chip with an aluminum nitride layer on a back side according to an embodiment.

FIG. 3A is a simulated heat map of a surface acoustic wave chip without a thermally conductive layer. The simulated chip includes a surface acoustic wave device similar to the surface acoustic wave device 10 of FIG. 1A and the surface acoustic wave device 19 of FIG. 1B except that an aluminum nitride layer is not included. As shown in the heat map of FIG. 3A, a maximum chip temperature was 93° C. in this simulation. The simulations in FIGS. 3A to 3C correspond to an input power of 30 dBm at a frequency of 1785 MHz.

FIGS. 3B and 3C show heat maps for simulations of surface acoustic wave devices with aluminum nitride layers arranged to dissipate heat. In the simulations for FIGS. 3B and 3C, a specific heat of $0.71 \times 10^3$ J/Kg·°K was used for aluminum nitride, a density of $3.26 \times 10^3$ Kg/m³ was used for aluminum nitride, and a thermal conductivity of 150 W/m·°K was used for aluminum nitride.

FIG. 3B is a simulated heat map of a surface acoustic wave chip with an aluminum nitride layer on an interdigital transducer electrode side according to an embodiment. The heat map of FIG. 3B corresponds to the surface acoustic wave device 10 of FIG. 1A with a 3 um aluminum nitride layer 12. As shown in the heat map of FIG. 3B, a maximum chip temperature was 83° C. in the simulation. Accordingly, this simulation represents a 10° C. maximum chip temperature improvement relative to the simulation corresponding to FIG. 3A.

FIG. 3C is a simulated heat map of a surface acoustic wave chip with an aluminum nitride layer on a back side according to an embodiment. The heat map of FIG. 3B corresponds to the surface acoustic wave device 19 of FIG. 1B with a 5 um aluminum nitride layer 12. As shown in the heat map of FIG. 3C, a maximum chip temperature was 73° C. in this simulation. Accordingly, this simulation represents a 20° C. maximum chip temperature improvement relative to the simulation corresponding to FIG. 3A.

The thermally conductive layers discussed herein can be implemented in a variety of filter assemblies. Surface acoustic wave filter assemblies include surface acoustic wave filters. FIGS. 4A to 7C illustrate example filter assemblies and related graphs. Any suitable principles and advantages of these filter assemblies can be implemented with each other and/or with other features discussed herein. Although embodiments may be discussed with reference to surface acoustic wave filters, any suitable principles and advantages related to the thermally conductive layer can be implemented in acoustic wave filter assemblies that include a surface acoustic wave filter and another acoustic wave filter. For instance, an acoustic wave filter assembly can include a surface acoustic wave filter, a bulk acoustic wave filter, and common thermally conductive layer arranged to dissipate heat from one of the filters to an area corresponding to the other filter. As another example, an acoustic wave filter assembly can include a surface acoustic wave filter, a Lamb wave filter, and common thermally conductive layer arranged to dissipate heat from one of the filters to an area corresponding to the other filter. As one more example, an acoustic wave filter assembly can include a surface acoustic wave filter, a boundary acoustic wave filter, and common thermally conductive layer arranged to dissipate heat from one of the filters to an area corresponding to the other filter.

FIG. 4A is a block diagram of a filter assembly 40 that includes filters implemented on separate chips with separate thermally conductive layers. FIG. 4A illustrates a first chip 42 that includes a transmit filter 43 and a second chip 44 that includes a receive filter 45. The transmit filter 43 and the receive filter 45 can be included in a duplexer or other multiplexer (e.g., a quadplexer, hexaplexer, octoplexer, etc.). The transmit filter 43 and the receive filter 45 can each include a surface acoustic wave device implemented in accordance with the principles and advantages of the surface acoustic wave filter 19 of FIG. 1B. In some other instances, the transmit filter 43 and/or the receive filter 45 can also be implemented in accordance with any suitable principles and advantages of the surface acoustic wave filter 10 of FIG. 1A, any suitable thermally conductive layer in accordance with any suitable principles and advantages discussed herein, any suitable piezoelectric layer, or any suitable combination thereof.

FIG. 4B is a cross sectional view of FIG. 4A. The transmit filter 43 filters a relatively high power signal and heat generation is relatively large. The relatively high power signal can be a radio frequency signal provided by a power amplifier. The receive filter 45 filters a relatively low power signal and heat generation is relatively small compared to the transmit filter 43. FIG. 4B includes arrows that illustrate heat flow and magnitude. As shown in FIG. 4B, a relatively large amount of heat flows from the IDT electrode 16A through the lithium niobate layer 14A to the aluminum nitride layer 12A of the transmit filter 43 and a relatively small amount of heat flows from the IDT electrode 16B through the lithium niobate layer 14B to the aluminum nitride layer 12B of the receive filter 45.

FIG. 4C illustrates temperature over position for the chips of FIG. 4A. FIG. 4C illustrates that most of the heat flow for the chips 42 and 44 is in the first chip 42. This is due to a transmit signal having a higher power than a receive signal in this instance. The aluminum nitride layer 12A implements heat spreading that causes maximum temperature of the first chip 42 to be decreased relative to a corresponding chip without an aluminum nitride layer.

FIG. 5A is a block diagram of a filter assembly 50 that includes filters implemented on separate chips with a common thermally conductive layer. The filter assembly 50 is similar to the filter assembly 40 of FIG. 4A except that a common aluminum nitride layer 12 is implemented under the chips 42 and 44 in the filter assembly 50.

FIG. 5B is a cross sectional view of FIG. 5A. FIG. 5B includes arrows that illustrate heat flow and magnitude. As shown in FIG. 5B, the aluminum nitride layer 12 can spread heat from the transmit filter 43 such that this heat can be dissipated in an area corresponding to the receive filter 45. The heat from the transmit filter 43 can be spread across the aluminum nitride layer 12 and into the lithium niobate layer 14B of the receive filter 45.

FIG. 5C illustrates temperature over position for the chips of FIG. 5A. As shown in FIG. 5C, the aluminum nitride layer can distribute heat from the transmit filter 43 to the receive filter area. This can cause heat in the transmit filter area to be reduced relative to the filter assembly 40 of FIG. 4A and thus decrease the maximum chip temperature.

FIG. 6A is a block diagram of a filter assembly 60 with a transmit filter 43 and a receive filter 45 implemented on a single chip 62 with a thermally conductive layer. As mentioned above, the transmit filter 43 and the receive filter 45 can be included in a duplexer or other multiplexer (e.g., a quadplexer, hexaplexer, octoplexer, etc.). In the filter assembly 60, such a duplexer or other multiplexer is implemented on a single chip. The filter assembly 60 is similar to the filter assembly 50 of FIG. 5A except that the filters 43 and 45 are implemented on the single chip 62. The transmit filter 43 and the receive filter 45 can be implemented closer to each other on the single chip 62 relative to being on separate chips like in the filter assembly 50 of FIG. 5A. This can further improve heat dissipation in certain applications.

FIG. 6B is a cross sectional view of FIG. 6A. FIG. 6B includes arrows that illustrate heat flow and magnitude. As illustrated in FIG. 6B, the aluminum nitride layer 12 can effectively spread heat from the transmit filter 43 to the receive filter area of the single chip 62.

FIG. 6C illustrates temperature over position for the chip of FIG. 6A. FIG. 6C shows significant improvement in maximum chip temperature by including the transmit filter 43 and the receive filter 45 on a single chip with an aluminum nitride layer relative to the filter assembly 40 of FIG. 4A.

FIG. 7A is a block diagram of a filter assembly 70 that includes transmit filters 43A and 43B implemented on a single chip 72 with a thermally conductive layer. The filter assembly 70 is like the filter assembly 60 of FIG. 6A except that a second transmit filter 43B is implemented in place of the receive filter 45 of FIG. 6A. FIGS. 7A to 7C illustrate that the principles and advantages discussed with reference to FIGS. 6A to 6C can be applied to any suitable multi-filter chip with multiple filters on a single chip in which one filter is generating a relatively large amount of heat while another filter is generating a relatively small amount of heat. For example, in the filter assembly 70, one transmit filter can be active while the other transmit filter is inactive. Heat from the active transmit filter can be spread and dissipated in an area of the inactive transmit filter.

FIG. 7B is a cross sectional view of FIG. 7A. FIG. 7B includes arrows that illustrate heat flow and magnitude. As shown in FIG. 7B, the aluminum nitride layer 12 can spread heat from the active transmit filter 43A to the inactive transmit filter area of the chip 72. FIG. 7C illustrates temperature over position for the chip 72 of FIG. 7A. FIG. 7C shows significant improvement in maximum chip temperature by including the transmit filters 43A and 43B on a single chip with an aluminum nitride layer relative to the filter assembly 40 of FIG. 4A. The maximum temperature of the chip 72 can be comparable to the maximum temperature of the chip 62 of FIG. 6A for transmit signals having similar power.

Simulation results indicate that a thermally conductive layer with a relatively high thermal conductivity, such as the aluminum nitride layer 12 of the surface acoustic wave device 19, can reduce maximum chip temperature. Simulation results also indicate that implementing multiple surface acoustic wave filters on a single chip (e.g., in accordance with FIGS. 6A to 6C or 7A to 7C) with such a thermally conductive layer can further reduce maximum chip temperature. Such improvement in maximum chip temperature can be realized with a relatively thin thermally conductive layer, for example, in accordance with any suitable principles and advantages discussed above.

FIGS. 5A to 7C illustrate filter assemblies that can dissipate heat from filtering a relatively high power radio frequency signal. A method of dissipating heat of a surface acoustic wave filter can be performed using any of these filter assemblies. A power amplifier can amplify a radio frequency signal to generate an amplified radio frequency signal. A surface acoustic wave device can filter the amplified radio frequency signal. Heat associated with the filtering can be dissipated using a thermally conductive sheet such that the heat is dissipated in an area corresponding to another acoustic wave filter. The thermally conductive sheet can be relatively thin. For instance, the thermally conductive sheet can be thinner than a piezoelectric layer of the surface acoustic wave filter.

Surface acoustic wave devices can be included in a filter. A filter that includes one or more surface acoustic wave devices can be referred to as a surface acoustic wave filter. Surface acoustic wave devices can be arranged as series resonators and shunt resonators to form a ladder filter. In some instances, a filter can include surface acoustic wave resonators and one or more other resonators (e.g., one or more other bulk acoustic wave resonators).

Figure 8:
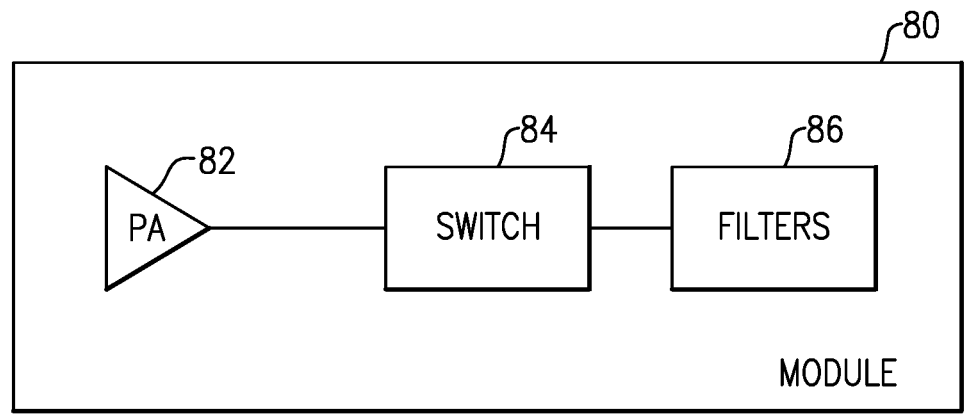
FIG. 8 is a schematic block diagram of a module that includes a power amplifier, a switch, and filters in accordance with one or more embodiments.
Figure 9:
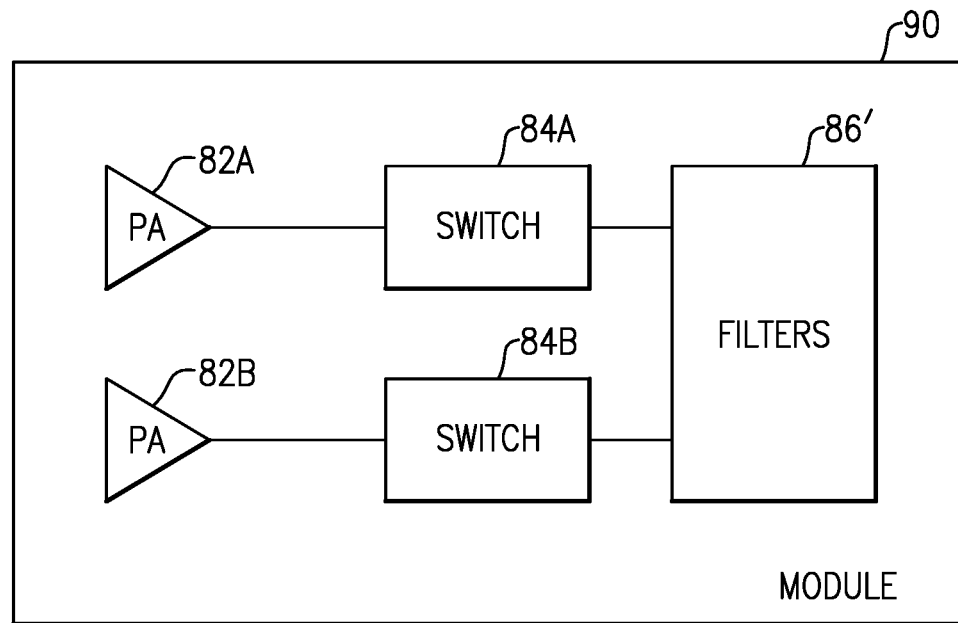
FIG. 9 is a schematic block diagram of a module that includes power amplifiers, switches, and filters in accordance with one or more embodiments.

The filters discussed herein can be implemented in a variety of packaged modules. Some example packaged modules will now be discussed in which any suitable principles and advantages of the filters discussed herein can be implemented. FIGS. 8, 9, and 10 are schematic block diagrams of illustrative packaged modules according to certain embodiments. A module arranged to process a radio frequency signal can be referred to as a radio frequency module.

FIG. 8 is a schematic block diagram of a module 80 that includes a power amplifier 82, a switch 84, and filters 86 in accordance with one or more embodiments. The module 80 can include a package that encloses the illustrated elements. The power amplifier 82, the switch 84, and the filters 86 can be disposed on a common packaging substrate. The packaging substrate can be a laminate substrate, for example. The power amplifier 82 can amplify a radio frequency signal. The power amplifier 82 can include a gallium arsenide bipolar transistor in certain applications. The switch 84 can be a multi-throw radio frequency switch. The switch 84 can electrically couple an output of the power amplifier 82 to a selected filter of the filters 86. The filters 86 can include any suitable number of surface acoustic wave filters and/or other acoustic wave filters. One or more of the surface acoustic wave filters of the filters 86 can be implemented in accordance with any suitable principles and advantages of the surface acoustic wave devices discussed herein.

FIG. 9 is a schematic block diagram of a module 90 that includes power amplifiers 82A and 82B, switches 84A and 84B, and filters 86' in accordance with one or more embodiments. The module 90 is like the module 80 of FIG. 8, except that the module 90 includes an addition power amplifier 82B and an additional switch 84B and the filters 86' are arranged to filter signals for the signals paths associated with a plurality of power amplifiers 82A and 82B. The different signal paths can be associated with different frequency bands and/or different modes of operation (e.g., different power modes, different signaling modes, etc.).

FIG. 10 is a schematic block diagram of a module 100 that includes power amplifiers 82A and 82B, switches 84A and 84B, and filters 86A and 86B in accordance with one or more embodiments, and an antenna switch 102. The module 100 is like the module 90 of FIG. 9, except the module 100 includes an antenna switch 102 arranged to selectively couple a signal from the filters 86A or the filters 86B to an antenna node. The filters 86A and 86B can correspond to the filters 86' of FIG. 9.

FIG. 11 is a schematic block diagram of a wireless communication device 110 that includes filters 86 in accordance with one or more embodiments. The wireless communication device 110 can be any suitable wireless communication device. For instance, a wireless communication device 110 can be a mobile phone, such as a smart phone. As illustrated, the wireless communication device 110 includes an antenna 111, an RF front end 112, an RF transceiver 114, a processor 115, and a memory 116. The antenna 111 can transmit RF signals provided by the RF front end 112. The antenna 111 can provide received RF signals to the RF front end 112 for processing.

The RF front end 112 can include one or more power amplifiers, one or more low noise amplifiers, one or more RF switches, one or more receive filters, one or more transmit filters, one or more duplexer, or any suitable combination thereof. The RF front end 112 can transmit and receive RF signals associated with any suitable communication standards. Any of the surface acoustic wave devices and/or filter assemblies and/or radio frequency modules discussed herein can be implemented in the RF front end 112.

The RF transceiver 114 can provide RF signals to the RF front end 112 for amplification and/or other processing. The RF transceiver 114 can also process an RF signal provided by a low noise amplifier of the RF front end 112. The RF transceiver 114 is in communication with the processor 115. The processor 115 can be a baseband processor. The processor 115 can provide any suitable baseband processing functions for the wireless communication device 110. The memory 116 can be accessed by the processor 115. The memory 116 can store any suitable data for the wireless communication device 110.

Any of the principles and advantages discussed herein can be applied to other systems, modules, chips, surface acoustic wave devices, filters, duplexers, multiplexers, wireless communication devices, and methods not just to the systems, modules, filters, multiplexers, wireless communication devices, and methods described above. The elements and operations of the various embodiments described above can be combined to provide further embodiments. Any of the principles and advantages discussed herein can be implemented in association with radio frequency circuits configured to process signals having a frequency in a range from about 30 kHz to 300 GHz, such as in a range from about 450 MHz to 6 GHz. For instance, any of the filters discussed herein can filter signals having a frequency in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as chips and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a vehicular electronics system such as an automotive electronics system, a microwave, a refrigerator, a stereo system, a digital music player, a camera such as a digital camera, a portable memory chip, a household appliance, etc. Further, the electronic devices can include unfinished products.

Conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application.

While certain embodiments have been described, these embodiments have been presented by way of example only, and are not intended to limit the scope of the disclosure. Indeed, the novel devices, chips, methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A surface acoustic wave device comprising:
  a piezoelectric layer;
  an interdigital transducer electrode on the piezoelectric layer;
  a temperature compensating layer over and in physical contact with the interdigital transducer electrode, the temperature compensating layer having a positive temperature coefficient of frequency and the piezoelectric layer having a negative temperature coefficient of frequency; and
  a thermally conductive layer configured to dissipate heat of the surface acoustic wave device, the thermally conductive layer having a thickness of at least 6.3 micrometers, the thermally conductive layer being thinner than the piezoelectric layer, the thermally conductive layer and the interdigital transducer electrode being on opposing sides of the piezoelectric layer, and the surface acoustic wave device is configured to generate a surface acoustic wave.

2. The surface acoustic wave device of claim 1 wherein the thermally conductive layer is in physical contact with the piezoelectric layer.

3. The surface acoustic wave device of claim 2 wherein the thermally conductive layer is an aluminum nitride layer, and the temperature compensating layer is a silicon dioxide layer.

4. The surface acoustic wave device of claim 3 wherein the thickness of the piezoelectric layer is less than 300 micrometers.

5. The surface acoustic wave device of claim 1 wherein the thermally conductive layer is an electrically insulating layer.

6. The surface acoustic wave device of claim 1 wherein the thermally conductive layer has a thermal conductivity that is at least 5 times a thermal conductivity of the piezoelectric layer.

7. The surface acoustic wave device of claim 1 wherein the thermally conductive layer has a thermal conductivity in a range from 23 W/mK to 300 W/mK.

8. The surface acoustic wave device of claim 1 wherein a thickness of the thermally conductive layer is less than half of a thickness of the piezoelectric layer.

9. The surface acoustic wave device of claim 1 wherein the thermally conductive layer includes a nitride.

10. The surface acoustic wave device of claim 1 wherein the thermally conductive layer includes aluminum nitride.

11. The surface acoustic wave device of claim 1 wherein the piezoelectric layer includes lithium niobate.

12. The surface acoustic wave device of claim 1 wherein the piezoelectric layer has a thickness of less than 300 micrometers.

13. The surface acoustic wave device of claim 1 wherein the temperature compensating layer is a silicon dioxide layer.

14. A radio frequency module comprising:
  a power amplifier configured to provide a radio frequency signal; and
  a surface acoustic wave filter configured to filter the radio frequency signal, the surface acoustic wave filter including a piezoelectric layer having a negative temperature coefficient of frequency, an interdigital transducer electrode on the piezoelectric layer, a temperature compensating layer having a positive temperature coefficient of frequency and being over the interdigital transducer electrode, and a thermally conductive layer configured to dissipate heat of the surface acoustic wave filter, the thermally conductive layer and the interdigital transducer electrode being on opposing sides of the piezoelectric layer, the thermally conductive layer having a thickness of greater than 6.3 micrometers, and the thermally conductive layer being thinner than the piezoelectric layer.

15. The radio frequency module of claim 14 wherein the surface acoustic wave filter and a second surface acoustic wave filter are implemented on a single die and the thermally conductive layer is configured to dissipate heat from the first acoustic wave filter over an area of the second surface acoustic wave filter.

16. The radio frequency module of claim 14 further comprising a radio frequency switch in a signal path between the power amplifier and the surface acoustic wave filter.

17. The radio frequency module of claim 14 wherein the thermally conductive layer has a thermal conductivity that is at least 25 times a thermal conductivity of the piezoelectric layer.

18. The radio frequency module of claim 14 wherein the thermally conductive layer has a thermal conductivity in a range from 140 W/mK to 300 W/mK.

19. The radio frequency module of claim 14 wherein the piezoelectric layer has a thickness of less than 300 micrometers.

20. A wireless communication device comprising:
    a surface acoustic wave filter configured to provide a filtered radio frequency signal, the surface acoustic wave filter including a piezoelectric layer, an interdigital transducer electrode on the piezoelectric layer, a temperature compensating layer over the interdigital transducer electrode, and a thermally conductive layer configured to dissipate heat, the thermally conductive layer having a thickness of greater than 6.3 micrometers, the thermally conductive layer being thinner than the piezoelectric layer, the thermally conductive layer and the interdigital transducer electrode being on opposing sides of the piezoelectric layer, and the temperature compensating layer having a positive temperature coefficient of frequency and the piezoelectric layer having a negative temperature coefficient of frequency; and
    an antenna configured to transmit the filtered radio frequency signal.

21. The wireless communication device of claim 20 further comprising a transceiver in communication with a radio frequency front end that includes the surface acoustic wave filter.

* * * * *